United States Patent [19]
Cooper et al.

[11] Patent Number: 6,008,549
[45] Date of Patent: Dec. 28, 1999

[54] SOLID-STATE HIGH VOLTAGE SWITCH AND SWITCHING POWER SUPPLY

[75] Inventors: James L. Cooper, Everett; Mark Adams, Arlington, both of Wash.

[73] Assignee: Eldec Corporation, Lynnwood, Wash.

[21] Appl. No.: 09/272,721

[22] Filed: Mar. 19, 1999

Related U.S. Application Data

[63] Continuation of application No. PCT/US96/15214, Sep. 23, 1996.

[51] Int. Cl.[6] .................................................. H01H 47/00
[52] U.S. Cl. .......................... 307/125; 307/139; 323/282; 361/56; 361/234
[58] Field of Search .................................... 307/113, 116, 307/125, 126, 127, 129–131, 134, 139, 141.4; 323/265, 271, 273, 282, 220; 361/101, 79, 88, 93, 234, 54, 56; 363/74

[56] References Cited

U.S. PATENT DOCUMENTS

| | | |
|---|---|---|
| 3,539,865 | 11/1970 | Billings . |
| 3,569,784 | 3/1971 | Carroll et al. . |
| 3,579,036 | 5/1971 | McCoy . |
| 4,054,933 | 10/1977 | Praeg . |
| 4,232,351 | 11/1980 | Baker . |
| 4,370,607 | 1/1983 | Dassonville . |
| 4,893,070 | 1/1990 | Milberger et al. . |
| 5,027,018 | 6/1991 | Kindlmann et al. . |
| 5,043,598 | 8/1991 | Maeda et al. . |
| 5,162,965 | 11/1992 | Milberger et al. . |
| 5,196,980 | 3/1993 | Carson . |
| 5,347,166 | 9/1994 | Schauder . |
| 5,491,603 | 2/1996 | Birang et al. . |
| 5,559,658 | 9/1996 | Cooper et al. ............................. 361/56 |
| 5,570,060 | 10/1996 | Edwards . |
| 5,612,850 | 3/1997 | Birang et al. ........................... 361/234 |
| 5,781,390 | 7/1998 | Notaro et al. ............................. 361/84 |

OTHER PUBLICATIONS

Cuthbert, D., "HV Crowbar Switches 2.4 MW," *Electronic Design*, Sep. 12, 1991, p. 144.

Cooper, J. et al., "A Solid State High Voltage Crowbar Device Applicable to Helmet–Mounted Display Rapid Disconnection," reprinted from *Helmet–and Head–Mounted Displays and Symbology Design Requirements II*, Proc. SPIE, vol. 2465, Apr. 18–19, 1995, Orlando, Florida, pp. 14–20.

*Primary Examiner*—Jeffrey Gaffin
*Assistant Examiner*—Peter Zura
*Attorney, Agent, or Firm*—Christensen O'Connor Johnson & Kindness PLLC

[57] ABSTRACT

A switching circuit (50) comprising cascaded transistor stages (52a, 52b... 52n and 54), connected between a high voltage terminal (62) and a sense resistor (RS) coupled to a low voltage terminal (64). The transistor stage (54) closest to the sense resistor (RS) is referred to as a current gain stage (54), and all the other transistor stages (52a, 52b... 52n) are referred to as component stages (52a, 52b... 52n). Blocking diodes (DD) are connected across all stages (52a, 52b... 52n and 54), forming a continuous path between the high voltage terminal (62) and the low voltage terminal (64). When an enable signal is provided to the current gain stage (54), the transistor stages (52a, 52b... 52n and 54) sequentially enter conduction, beginning with the current gain stage (54) and proceeding through the component stages (52a, 52b... 52n). As each transistor stage (52a, 52b... 52n) enters conduction, the resulting voltage drop will cause each corresponding blocking diode (DD) to avalanche, allowing current to flow. Eventually, all of the component stages (52a, 52b... 52n) are turned on, creating a conductive path through the stages (52a, 52b... 52n) and completing the switching of the switching circuit (50).

22 Claims, 6 Drawing Sheets

SOLID-STATE HIGH VOLTAGE SWITCH AND SWITCHING POWER SUPPLY

This is a continuation of International Application PCT/US96/15214, with an international filing date of Sep. 23, 1996.

FIELD OF THE INVENTION

The present invention relates generally to high voltage power supplies, and more particularly to a power supply having a solid-state switch for switching a high voltage or a floating high voltage in a controlled manner.

BACKGROUND OF THE INVENTION

In many applications, it is desirable to switch high voltages. One application requiring switching high voltage levels is in conjunction with bipolar electrostatic chucks that are used in the semiconductor wafer manufacturing industry. Bipolar electrostatic chucks are used to hold semiconductor wafers during the manufacturing process. To hold a wafer, direct current (DC) high voltages of opposite polarity are applied to a pair of chuck electrodes. After the wafer is lowered onto the chuck electrodes, an electrostatic charge is applied to the wafer. The charges on the wafer and the chuck electrodes produce an electrostatic attractive force that presses the wafer against the upper face of the chuck. The chucking voltages are set to a high enough value to produce an electrostatic force between the wafer and the chuck that is adequate to prevent wafer movement during subsequent process steps. Typically, the chucking voltage may range between ±300 and ±3000 volts.

After completion of any semiconductor fabrication process steps, the wafer must be "dechucked," or removed from the electrostatic chuck. To remove the wafer, the chucking voltage is typically turned off and the chuck electrodes and the wafer connected to ground. Grounding the components removes the respective charges that have accumulated on the chuck electrodes and the wafer during the chucking process. The elimination of the electrostatic force therefore allows the wafer to be easily removed.

A recognized problem with the above-described method of removing a wafer from an electrostatic chuck is that repetitively charging and grounding the chuck electrodes causes the electrodes to retain some charge. If any electrostatic attractive force remains between the wafer and the chuck due to the retained charge, excessive force may be required to remove the wafer. The force can crack the wafer or cause the wafer to pop off the chuck into a position from which it is difficult to retrieve and align properly in an automatic assembly line.

Several different techniques have been suggested to solve the wafer sticking problem. In one technique, the polarity of the chucking voltages placed on the chucking electrodes is periodically reversed. For example, after a period of operation during which the first electrode is kept at +3000 volts and the other electrode kept at −3000 volts, the polarity of each electrode is switched so that the first electrode is operated at −3000 volts and the second electrode operated at +3000 volts. Periodically changing the polarity of the chucking voltage has been found to remove the tendency of the chuck electrodes to retain an electrostatic charge.

FIG. 1 depicts a representative circuit of a switching power supply 8 that may be used to reverse the polarity of a chucking voltage applied to one of the chuck electrodes. A first high voltage DC generator 10 produces a high voltage on an output line 12, for example 3000 volts. A second high voltage DC generator 14 produces a high voltage of the opposite polarity on a load line 16, for example −3000 volts. The load line is connected to one of the chuck electrodes for application of the chucking voltage. In order to allow the polarity of the chucking voltage to be reversed, two switches are provided in the power supply. A first high voltage switch SW1 is connected between the output of the first high voltage generator 10 and the load line 16. A second high voltage switch SW2 is connected between the second high voltage generator 14 and ground. When switch SW1 is closed, switch SW2 open, and the second high voltage generator turned off, the load line 16 is maintained at +3000 volts. When switch SW1 is open, switch SW2 closed, and the second high voltage generator turned on, the load line 16 is maintained at −3000 volts. Appropriately switching the two switches and the high voltage generators therefore allows the voltage on the load line to be switched between the two high voltage potentials, in this particular case causing a reversal in the output voltage polarity on one of the chuck electrodes. A second power supply similar to that shown in FIG. 1 is required to switch the polarity of the other chuck electrode.

While the design of the switching power supply 8 is very simple, in practice it is very difficult to construct the supply and achieve suitable performance. The implementation difficulty lies in the construction of switches SW1 and SW2. Power supply manufacturers have attempted to use high voltage electromechanical relays as switches in the power supply. Two problems have arisen with the use of relays, however. First, high voltage electromechanical relays are notoriously unreliable and have a tendency to fail periodically. Especially in automated assembly lines where the power supply switches are continuously cycled on and off, such failure is generally undesirable.

Second, the switching time of electromechanical relays is uncontrolled and often too fast to allow for compensation by other components within the switching power supply. For example, the high voltage provided on output line 12 must generally be maintained at an exact level for use in the electrostatic chuck. When switch SW1 is closed very quickly, the first high voltage generator 10 is connected with the load line 16 causing the load placed on the generator to increase suddenly. Because of the rapidity of the relay switching, the high voltage generator cannot immediately compensate for the change in load, causing the output from the generator to droop. Although the first high voltage generator will ultimately compensate for the added load, the droop in the output from the power supply is detrimental to the operation of the electrostatic chuck. For example, the droop in output voltage may result in dechucking and loss of a wafer or damage to the chuck.

SUMMARY OF THE INVENTION

The present invention provides a solid-state switching circuit for switching high voltages in a controlled and linear manner in a high voltage power supply. The switching circuit consists of multiple MOSFET transistor stages connected in cascade. One end of the switching circuit is connected to a first high voltage potential. The other end of the switching circuit is coupled to a second high voltage potential, which is lower than the first high voltage potential, (hereinafter referred to as the "low voltage potential"). In the preferred embodiment, a blocking diode is connected in parallel with each stage. There is therefore a continuous series of discrete blocking diodes between the high and low voltage potentials.

Each stage in the high voltage switching circuit can be biased on or off. When biased on, the stage provides a conductive path. When biased off, the stage acts as an open circuit up to the breakdown value of the blocking diode across each stage. The stage coupled to the low voltage potential is a current gain stage, and includes a current sense resistor in the conductive path. The stages coupled to the current gain stage do not contain a sense resistor, and will hereinafter be referred to as the component stages.

In order to control the high voltage switching circuit, the current gain stage is coupled to a driver stage. An enable signal provided by the driver stage biases the current gain stage so that the gain stage begins to conduct current. When biased on, the current flow through the gain stage causes the adjacent component stage to be biased on. The current flow through the adjacent component stage then causes the next component stage to be biased on. The process continues with each component stage turning on after the stage below it turns on.

The blocking diodes in the component stages of the switching circuit will avalanche at a known voltage rating. As the component stages are biased on, the blocking diodes across the component stages that are still biased-off will enter into conduction when the total voltage drop across the diodes exceeds the sum of the diode avalanche voltage ratings. Current will therefore flow through the avalanching diodes of the biased-off stages, through the transistors of the biased-on stages, and through the sense resistor as the upper component stages continue to turn on one-by-one. Eventually, all of the component stages are turned on, creating a conductive path through the stages and completing the switching of the switching circuit.

In accordance with one aspect of the invention, a feedback circuit is provided in the current gain stage to closely control the current flowing through the stage and the sense resistor. The feedback circuit changes the bias point of the transistor in the current gain stage to maintain the current flow at a desired rate In accordance with another aspect of the invention, the rate with which the component stages are biased on depends on the current flow through the current gain stage. During the period it takes for each subsequent component stage to be biased on, the voltage across the switching circuit is reduced in a controlled manner. In this manner, the switching circuit ensures a linear and controlled switch between the high voltage potential and the low voltage potential.

In accordance with yet another aspect of the invention, the controlled switching between the high voltage potential and the low voltage potential allows the switching circuit to be incorporated in a high voltage switching power supply. Incorporating one or more switching circuits in the power supply allows the power supply to produce an output voltage that can be reversed in polarity, or smoothly transitioned between multiple voltage levels.

In accordance with still another aspect of the invention, the component stages are biased by the enable signal that is applied to the current gain stage. Biasing all of the component stages with the enable signal minimizes the number of components within the switching circuit.

In accordance with yet another aspect of the invention, the current gain stage may be isolated from the driver stage by a transformer. The transformer isolates the switching circuit from the system or power supply in which the switching circuit is incorporated, allowing the switching circuit to operate in a fully floating mode.

In accordance with still another aspect of the invention, the number of component stages can be varied to change the voltage that is switched. Each component stage can switch a voltage roughly equivalent to the avalanche voltage rating of the blocking diode across the stage. The number of component stages may therefore be selected depending on the anticipated maximum voltage swing in the switching operation, allowing the switching circuit to be simply and easily configured to operate in different environments.

An advantage of the disclosed switching circuit is that it allows high voltages to be switched to a linear and controlled manner. The controlled switching reduces the amount of stress placed on the components in the switching circuit, allowing the circuit to be constructed using MOSFET transistors. The controlled switching also allows the circuit to be incorporated in certain applications, such as power supplies for electrostatic chucks, where a longer switching time allows for compensation by other system components. For example, voltage droop is eliminated in the power supply because the longer switching time provides the high voltage generators sufficient time to compensate for any additional load.

Another advantage of the switching circuit is that it uses solid-state components that are readily available and relatively inexpensive. Because solid-state components are used, the entire switching circuit can be constructed to displace a very small volume and be of minimal weight. Constructing the switching circuit with solid-state components also makes the circuit more reliable than using a traditional electromechanical relay.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 2:
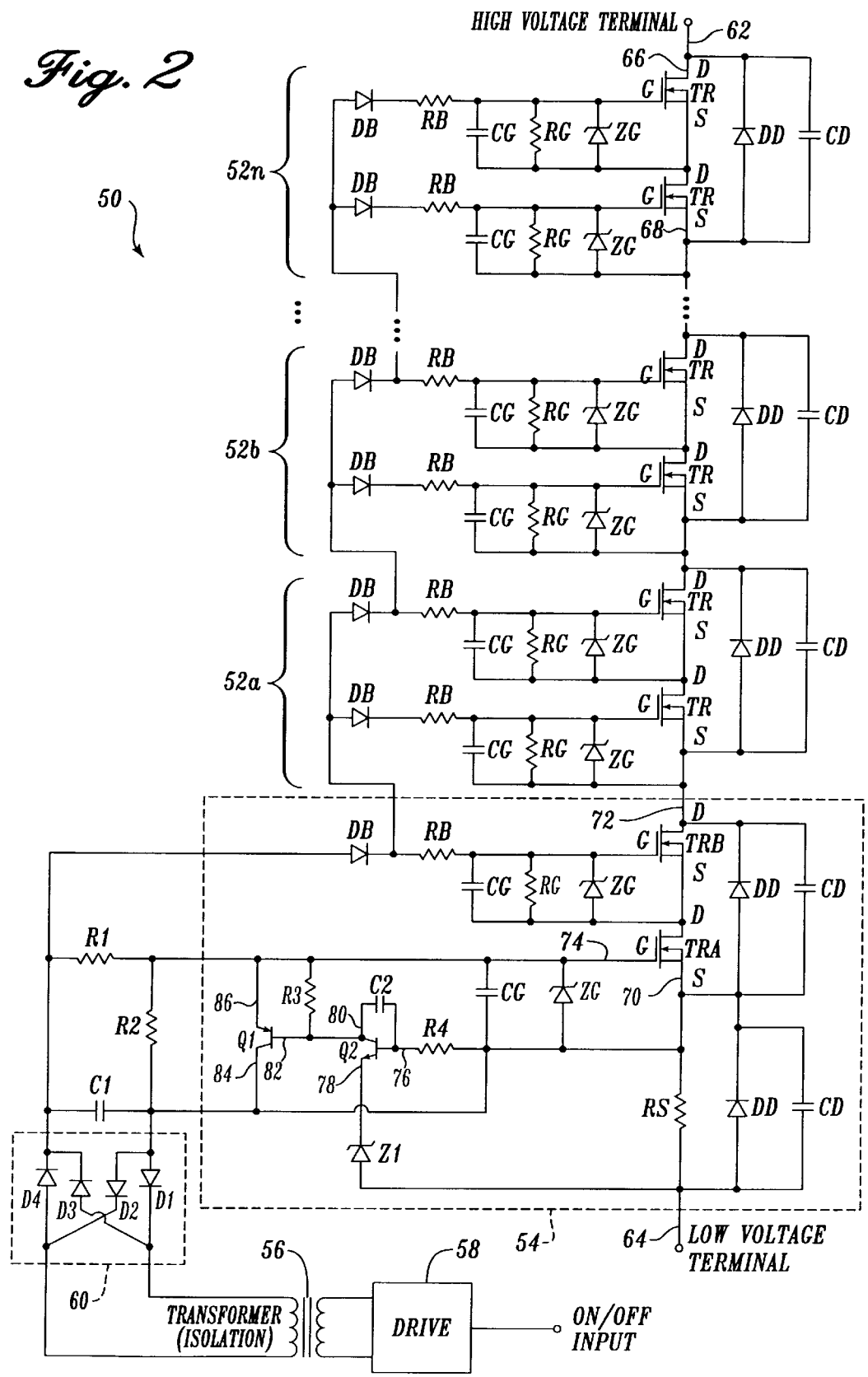
FIG. 2 is a schematic of a solid-state switching circuit of the present invention in a floating configuration, wherein a current gain stage containing a sense resistor is used to regulate the current flow through the circuit during switching.

FIG. 2 depicts the preferred embodiment of a solid-state switching circuit 50 in accordance with the present invention. Switching circuit 50 consists of a number of component stages 52a, 52b, . . . 52n connected in cascade with a current gain stage 54. As will be described in more detail below, the switching circuit switches between one of two states. In an "off" state, the component stages 52a, 52b, . . . 52n and the current gain stage 54 are initially biased off so that there is no conductive path between a first high voltage terminal 62

(hereinafter referred to as the high voltage terminal) and a second high voltage terminal 64 (hereinafter referred to as the low voltage terminal). To turn the switching circuit "on" an enable signal is applied to the current gain stage 54. The current gain stage 54 is biased on and provides a current path through the current gain stage. Current flow through the current gain stage biases on the adjacent component stage 52a, which then biases on component stage 52b, and so on. The component stages 52a, 52b, . . . 52n are therefore biased on sequentially, beginning with the component stage closest to the current gain stage, and ending with the component stage that is connected to the high voltage terminal. When all of the component stages are biased on, a conductive path is provided through each component stage and the current gain stage between the high voltage terminal and the low voltage terminal.

Preferably a blocking diode DD is connected in parallel with each stage. Since the voltage drop across a biased-on stage is very low, the voltage applied across the string of blocking diodes DD for the biased-off stages is increased as the stages turn on sequentially starting with the stage adjacent to the current gain stage. Ultimately, the voltage drop across the string of blocking diodes of the stages that are not yet biased on causes the diodes to operate in avalanche and provide a current path from the high voltage terminal, around the stages that remain biased off, and through the biased-on component stages and current gain stage to the low voltage terminal. The rate at which the component stages are biased on is controlled by the regulated current through the current gain stage as discussed in greater detail below. The sequential biasing of the component stages in combination with the current regulation in the current gain stage results in a controlled and linear drop in the voltage across the switching circuit, allowing the switching time of the circuit to be tailored to a particular application.

Examining the preferred construction of the switching circuit 50 in more detail, it is first noted that each component stage 52a, 52b, . . . 52n is constructed with the same circuit elements. For purposes of this description, a generic component stage 52n will therefore be discussed as representative of all the component stages. Component stage 52n is constructed around a pair of transistors TR, which in the preferred embodiment of the circuit are a pair of MOSFETs connected in cascade. A blocking diode DD is connected between the drain 66 of the first transistor TR and the source 68 of the second transistor TR. A capacitor CD is connected in parallel with the blocking diode.

Each transistor TR is biased with an identical biasing circuit. A resistor RG is connected across the gate and source of each transistor, and in parallel with a capacitor CG and a Zener diode ZG. Resistor RG and Zener diode ZG are selected to prevent the transistor from conducting due to leakage current during biased-off operation, to protect the transistor from gate-to-source stress during biased-on operation, and to provide the desired gate-to-source voltage to turn the transistor on when a conductive path is generated. The gate of each transistor in the component stage is connected in series with a diode DB and a resistor RB. Diodes DB are selected to ensure that reverse current will not flow between the component stages. Resistors RB are sized to limit the current flow into the component stage when the switching circuit is biased on. In an actual embodiment of the switching circuit, where each component stage is used to switch approximately 1000 volts, the circuit elements for each component stage are as follows:

| Component | Part Number or Rating |
| --- | --- |
| Diode DD | BYD37M, BYW56 |
| Capacitor CD | 10 pF |
| Transistors TR | MTD1N80E |
| Zener Diode ZG | BZX84C15, 14.7 V |
| Resistor RG | 10K, ¼ Watt |
| Capacitor CG | 1000 pF |
| Diode DB | BYD37M |
| Resistor RB | 1K, ¼ Watt |

At the heart of the switching circuit 50 is the current gain stage 54. The current gain stage is similar to the component stages in that it is constructed around a pair of transistors TRA and TRB, preferably both MOSFETs. A sense impedance, preferably a sense resistor RS, is connected between the source 70 of transistor TRA and the low voltage terminal 64 in the switching circuit conductive path. The sense resistor is selected to have a peak power capability sufficient to conduct the desired current when the switching circuit is turned on. A diode DD and a capacitor CD are connected between the source 70 of transistor TRA and the drain 72 of transistor TRB. A diode DD and a capacitor CD are also connected in parallel with the sense resistor RS. Diodes DD and capacitors CD serve the same functions as they do in the component stages, that is, they are selected to provide over-voltage protection for the circuit. In an actual embodiment of the switching circuit, the circuit elements for the current gain stage are as follows:

| Component | Part Number or Rating |
| --- | --- |
| Transistors TRA and TRB | MTD1N80E |
| Sense Resistor RS | Approximately 3.4K |
| Diode DD | BYD37M, BYW56 |
| Capacitor CD | 10 pF |
| Capacitor CG | 1000 pF |
| Resistor RG | 10K |

A drive circuit 58 is connected to the switching circuit 50 to turn the switching circuit on. The drive circuit 58 generates a square wave that is applied to the primary winding of a transformer 56. Preferably, the square wave has a fifty percent duty cycle, although other periodic waveforms having different duty cycles may also be used. The secondary winding of the transformer 56 is connected a full-bridge rectifier 60 comprised of diodes D1, D2, D3, and D4. The diodes rectify the output of the transformer 56 to create a DC voltage that acts as the enable signal to turn on the switching circuit. The use of a transformer to connect the drive circuit to the switching circuit allows the isolated operation of the switching circuit without reference to a ground potential. While a transformer is preferred, those skilled in the art will recognize that other components could be used to isolate the switching circuit and allow for floating operation.

The enable signal performs two functions in the switching circuit. The enable signal is applied to the diodes DB in the component stages as a biasing potential. The enable signal provides sufficient potential to the gates of the component stage transistors TR so that they will become biased on when the gate-to-source turn-on voltage of each transistor is exceeded by a voltage across resistor RG. That is, each transistor TR will become biased on when the current flow through resistor RG causes a voltage drop across the resistor that exceeds the turn-on voltage of each transistor.

The enable signal is also applied to the current gain stage 54 to bias the stage on. The enable signal is first applied to a capacitor C1 connected across the output of the rectifier 60, which filters the enable signal. The enable signal is then applied to a voltage divider consisting of resistors R1 and R2 connected in series across the output of the rectifier 60. The connection between resistors R1 and R2 is coupled to the gate of transistor TRA. The rectified and filtered enable signal is stepped-down by the voltage divider and applied to the gate of transistor TRA to bias the transistor on.

The bias point of transistor TRA is governed by a feedback loop to ensure that a desired current flows through the sense resistor, controlling the switching rate of the switching circuit. As in the other component stages, a Zener diode ZG sized to limit the voltage applied to transistor TRA is connected between the gate 74 and source 70 of the transistor. A capacitor CG is also connected between the gate and source of the transistor in order to filter the biasing voltage applied to the transistor TRA. The feedback loop to ensure constant current through the sense resistor is constructed with two transistors Q1 and Q2, which are preferably bipolar junction (BJT) transistors. Transistor Q2 is an npn transistor that is connected so that the bias point of the transistor is dependent on the voltage drop across the sense resistor RS. The base 76 of transistor Q2 is connected to a first lead of the sense resistor through a resistor R4. The emitter 78 of transistor Q2 is connected to the second lead of the sense resistor through a Zener diode Z1. The collector 80 of transistor Q2 is connected to the gate 74 of transistor TRA through a resistor R3. A capacitor C2 is connected between the base and collector of the transistor Q2. In this configuration, the current flow through transistor Q2 will change depending upon the voltage drop across the sense resistor RS.

Transistor Q1 is a pnp transistor that is controlled by the current flowing through transistor Q2. The base 82 of transistor Q1 is connected to the collector 80 of transistor Q2, and also to the gate 74 of transistor TRA through a resistor R3. The collector 84 of transistor Q1 is connected to the first lead of the sense resistor RS. The emitter 86 of the transistor Q1 is connected to the gate 74 of transistor TRA. Based on the bias point, transistor Q1 shunts current away from the gate of transistor TRA. In an actual embodiment of the feedback circuit, the circuit elements are as follows:

| Component | Part Number or Rating |
|---|---|
| Transistor Q1 | 2N3906 |
| Transistor Q2 | 2N3904 |
| Resistor R3 | 10K |
| Resistor R4 | 1K |
| Capacitor C2 | 1000 pF |
| Zener Diode Z1 | 1N4625 |

The feedback circuit controls the current flowing through transistor TRA to maintain the current at a desired level. Load current flowing through the sense resistor RS generates a voltage drop that changes the bias points of transistors Q2 and Q1. If the current through the sense resistor increases, transistor Q1 will shunt additional current away from the gate of transistor TRA to reduce the current flowing through the transistor. If the current through the sense resistor decreases, transistor Q1 will shunt less current away from the gate of transistor TRA to increase current through the transistor. In this manner, the feedback circuit ensures that the current flow through the sense resistor RS is maintained at a desired level.

Turning now to the operation of the overall switching circuit, before an enable signal is received to actuate the switching circuit, component stages 52a, 52b, . . . 52n are biased off so that the transistors are nonconducting. Similarly, the current gain stage 54 is biased off, ensuring that no current flows through the sense resistor RS. With all the stages in the switching circuit biased off, the impedance of the switching circuit as measured between the high and low voltage terminals is therefore very high. Since the off impedance of each stage exceeds one gigaohm, the switching circuit essentially acts as an open circuit.

When it is desired to actuate the switching circuit to connect the high voltage terminal 62 with the low voltage terminal 64, an enable signal is generated by the drive circuit 58 and applied to the current gain stage 54 through the isolation transformer 56 and rectifier 60. The enable signal biases transistor TRA on. At the same time, the enable signal causes a biasing potential to be applied to the gates of transistors TR through diodes DB and resistor RB.

After the current gain stage transistor TRA is biased on, a current path is provided through diode DB, resistor RB, and resistor RG of the directly adjacent transistor TRB, and through the current gain stage transistor TRA and sense resistor RS to the low voltage terminal. When the voltage across resistor RG rises sufficiently above the gate-to-source potential threshold of transistor TRB, the transistor is biased on. This process repeats for each of the transistors TR in the component stages, and for each of the component stages. The transistors TR of each component stage remain biased off, and nonconducting, while the component stages located nearest the driver stage sequentially enter conduction. The transistors within component stage 52a therefore enter conduction first, followed by component stage 52b, and proceeding until component stage 52n is conducting.

As the component stages become biased on and conducting, the voltage differential between the high and low voltage terminals is applied across fewer and fewer component stages whose transistors are still biased off. Eventually, the applied voltage is sufficiently great to force the blocking diodes of the biased-off stages into avalanche, allowing current to flow from the high voltage terminal 62 through the avalanching diodes to the component stages that are conducting. The current then flows through the remaining biased-on transistors in each component stage, through the current gain stage transistors TRA and TRB, sense resistor RS, and finally to the low voltage terminal 64. The component stages continue to turn on sequentially. As each component stage turns on, the output voltage at the low voltage terminal 64 increases by an amount roughly equivalent to the avalanche voltage rating of the blocking diode across the component stage. The rate that the voltage increases is limited, however, by the rate of current flow through the current gain stage. Eventually, the transistors in all of the component stages have been turned on and a conductive path is present from the high voltage terminal to the low voltage terminal. When this occurs, the potential at the low voltage terminal will have been raised to approximately the potential of the high voltage terminal.

The result is that over a short period of time, and in a controlled manner, the low voltage terminal is connected to the high voltage terminal. The switching rate is dependent on the current flow through the sense resistor. The switching rate is also dependent on any capacitive component contained within a load connected to the switching circuit.

Figure 3:
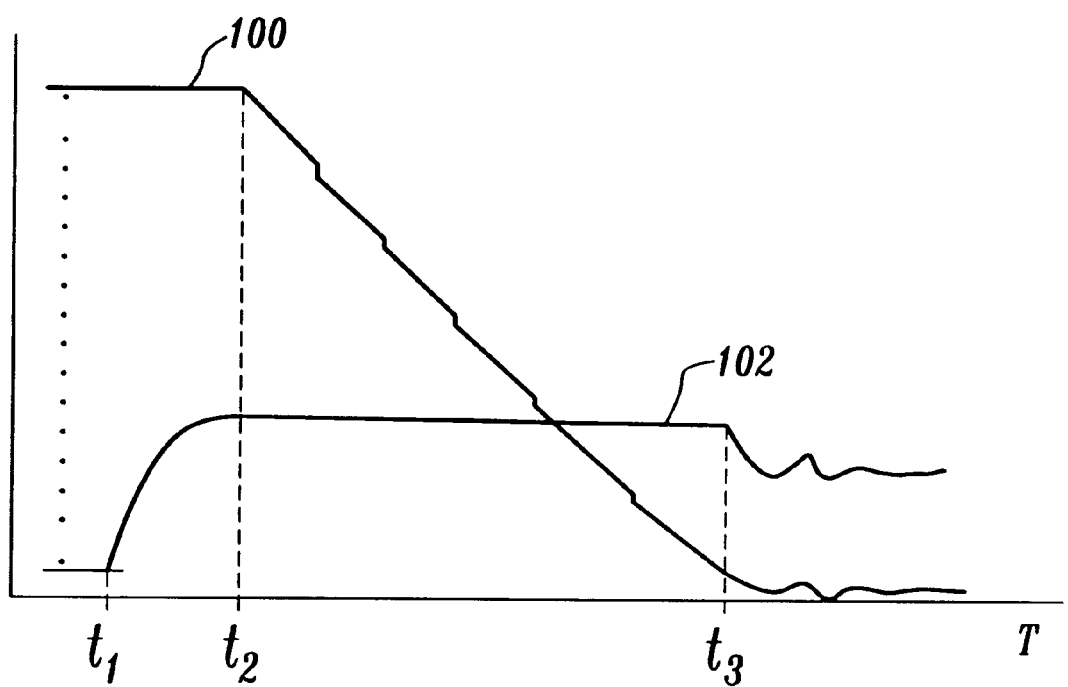
FIG. 3 is a graph of the voltage across the switching circuit and the current through the switching circuit versus time generated by a representative embodiment of the invention.

FIG. 3 is a representative graph of the voltage drop between the high and low voltage terminals 62 and 64, and the current through the switching circuit during a typical switching operation. Line 100 represents the voltage between the high and low voltage terminals, and line 102 is the current through the sense resistor RS. At time $t_1$, the enable signal is turned on, biasing the current gain stage on and causing current to begin to flow through the sense resistor. At time $t_2$, the first component stage begins to enter conduction. During the time it takes before the next component stage is turned on, the voltage across the biased-on stage changes from a value close to the breakdown voltage of the diode to approximately no voltage when the stage is conducting. The voltage change is linear and controlled, due to the current regulation provided by the current gain stage. That is, the current through the sense resistor RS is maintained at approximately a constant level dictated by the current gain stage, as indicated by the horizontal line 82. As each component stage is biased on, the voltage across the switching circuit therefore continues to drop in a linear fashion. At time $t_3$, the conduction path in the switching circuit is complete, and the voltage drop across the circuit is approximately equal to the amount of any load current flowing through the switching circuit multiplied by the value of the sense resistor RS.

As noted above, each component stage contributes to switching a voltage potential equal to the maximum avalanche voltage of the blocking diode for that stage. In the preferred embodiment, the blocking diodes DD are selected to avalanche before transistors TR. The diode rating of each component stage 52a, 52b, ... 52n and the current gain stage 54 is therefore used to determine the number of component stages necessary to switch a particular voltage. For example, if the switching circuit were to switch 6,000 volts, and if blocking diodes rated at 1,000 volts were used in the switching circuit, a total of five component stages would be required in the switching circuit. The total avalanche voltage of the five blocking diodes in the component stages and the single blocking diode in the current gain stage would add to a number approximating the required switching voltage of 6,000 volts. It will be appreciated that a greater or lesser number of component stages could be used to select the switching voltage of a switching circuit. Moreover, diodes having different ratings may also be selected to change the switching voltage capability. In most cases, however, the sum of the diode avalanche voltages must exceed the total voltage to be switched to prevent the blocking diode chain from conducting prior to application of the enable signal.

Figure 4:
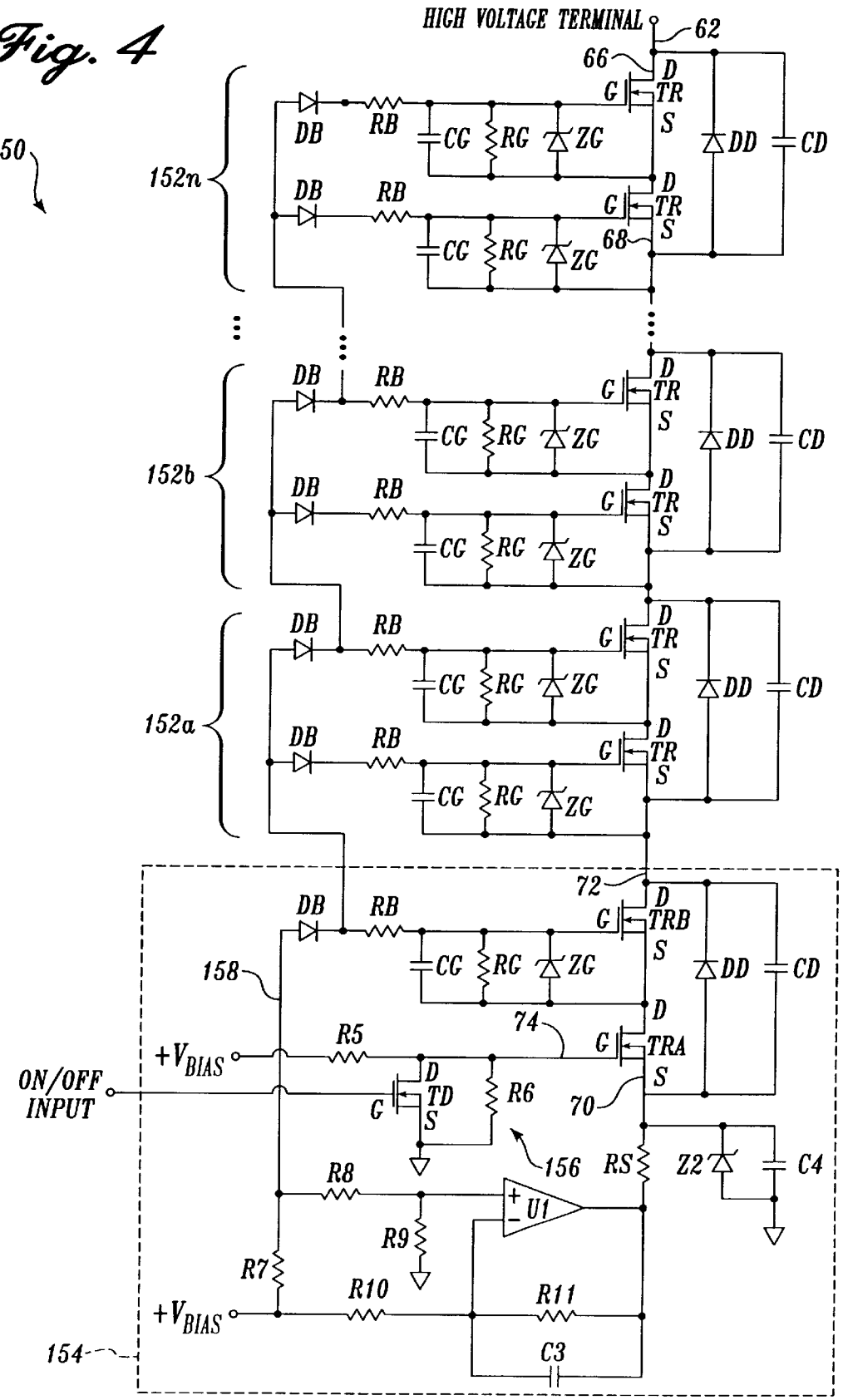
FIG. 4 is a schematic of a solid-state switching circuit of the present invention that is referenced to ground.

The switching circuit 50 depicted in FIG. 2 is designed so that it may operate in a floating mode, that is, without reference to ground. In other applications it may be desirable to connect the switching circuit to ground. A switching circuit 150 that has been modified so that it is referenced to ground is depicted in FIG. 4. The component stages 152a, 152b, ... 152n in switching circuit 150 are identical in construction to those shown in switching circuit 50. Moreover, the component stages operate in the same manner as in switching circuit 50, turning on sequentially starting with the stage closest to a current gain stage 154 and continuing until all of the component stages have entered conduction. The difference between switching circuit 50, which is floating, and switching circuit 150, which is referenced to ground, is therefore found in the construction of the current gain stage 154.

The current gain stage 154 in switching circuit 150 is constructed around a pair of transistors TRA and TRB, preferably both MOSFETs. A sense impedance, preferably a sense resistor RS, is connected between the source 70 of transistor TRA and an output of an operational amplifier U1. The sense resistor is selected to have a peak power capability sufficient to conduct the desired current when the switching circuit is turned on. A Zener diode Z2 and a capacitor C4 are connected in parallel between the source 70 of transistor TRA and ground. The Zener diode and capacitor operate to prevent current surges from damaging the operational amplifier U1.

Transistor TRA is biased on by an enable signal that is provided by an enable circuit 156 connected to the gate 74 of the transistor. The enable circuit 156 consists of a transistor TD, preferably a MOSFET, having a source connected to ground, a drain connected to a DC power supply through a resistor R5, and a gate connected to an on/off input terminal. A resistor R6 is connected between the drain and source of transistor TD. The drain of transistor TD is also connected to the gate 74 of transistor TRA. A signal received on the on/off input terminal causes transistor TD to enter conduction, applying a biasing voltage to the gate of the transistor TRA. The biasing voltage turns on the transistor TRA, allowing the transistor to conduct current through the sense resistor RS.

The amount of current flowing through sense resistor RS is determined by a feedback circuit containing the operational amplifier U1. Line 158 connects the diodes DB in the component stages 152a, 152b, ... 152n to a power supply through a resistor R7, shown at the lower left of FIG. 5. The component stages are therefore floating, so that the transistors TR will enter into conduction when the gate-to-source potential across the resistor RG in each component stage exceeds the turn-on voltage of the each transistor. The lead of resistor R7 that is connected to line 158 is also connected to the noninverting input of operational amplifier U1 through a voltage divider consisting of a resistor R8 and a resistor R9. The inverting input of amplifier U1 is connected to the power supply through a resistor R11. The noninverting input of the operational amplifier is also connected to the output of the operational amplifier through the parallel combination of a resistor R11 and a capacitor C3.

After the switching circuit 150 is turned on and the component stages begin to sequentially enter conduction, the bias current provided through resistor R7 will increase. Due to the voltage drop across the resistor R7, the noninverting input of operational amplifier U1 will be at a lower potential than the noninverting input. The difference in potentials on the inputs of the operational amplifier cause the output of the operational amplifier to generate a negative voltage. Preferably, the feedback circuit is designed so that when all of the component stages 152a, 152b, ... 152n are biased on, the negative voltage produced at the output of operational amplifier U1 is sufficiently negative so that the flow of the bias current through the sense resistor RS generates zero volts at the source 70 of the transistor TRA. That is, the component of the voltage at the source 70 of the transistor TRA due to the bias current flowing through the sense resistor RS is zero when all of the component stages are turned on.

Designing the feedback circuit in this manner ensures that any potential across the sense resistor RS during operation of the switching circuit is therefore directly attributable to the load current flowing through transistor TRA, and not due to the bias current flowing to bias the component stages. As the load current flows through the sense resistor, the bias point of transistor TRA changes since the gate-to-source voltage of the transistor is changing with the load current. The load current flowing through the sense resistor is referenced to ground through the operational amplifier U1. The current through the switching circuit is thereby regulated so that the change in potential across the switching circuit is made in a controlled and linear manner.

Figure 1:
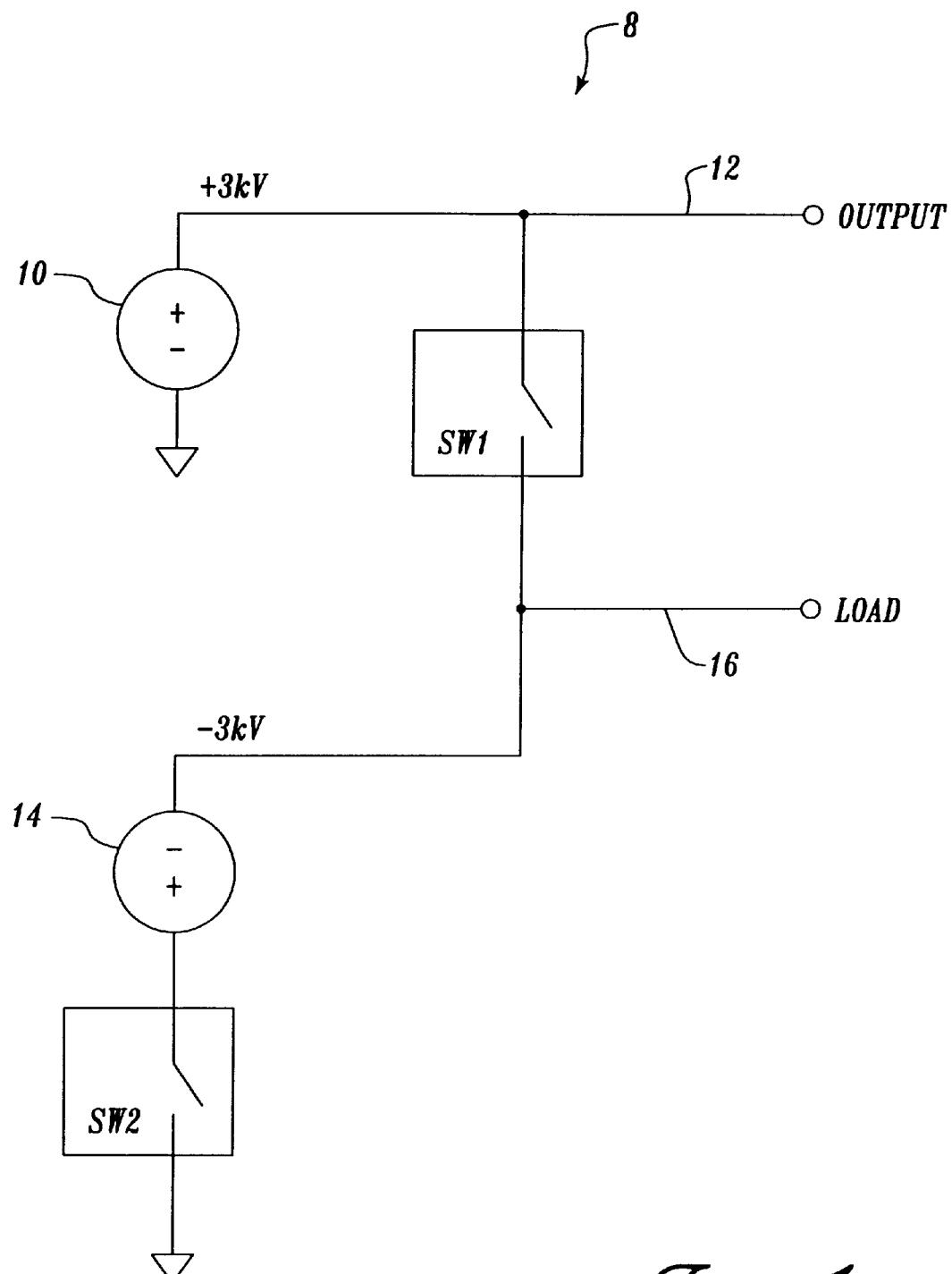
FIG. 1 is a block diagram of a representative prior art switching power supply having an output that is switched between two voltages.
Figure 5:
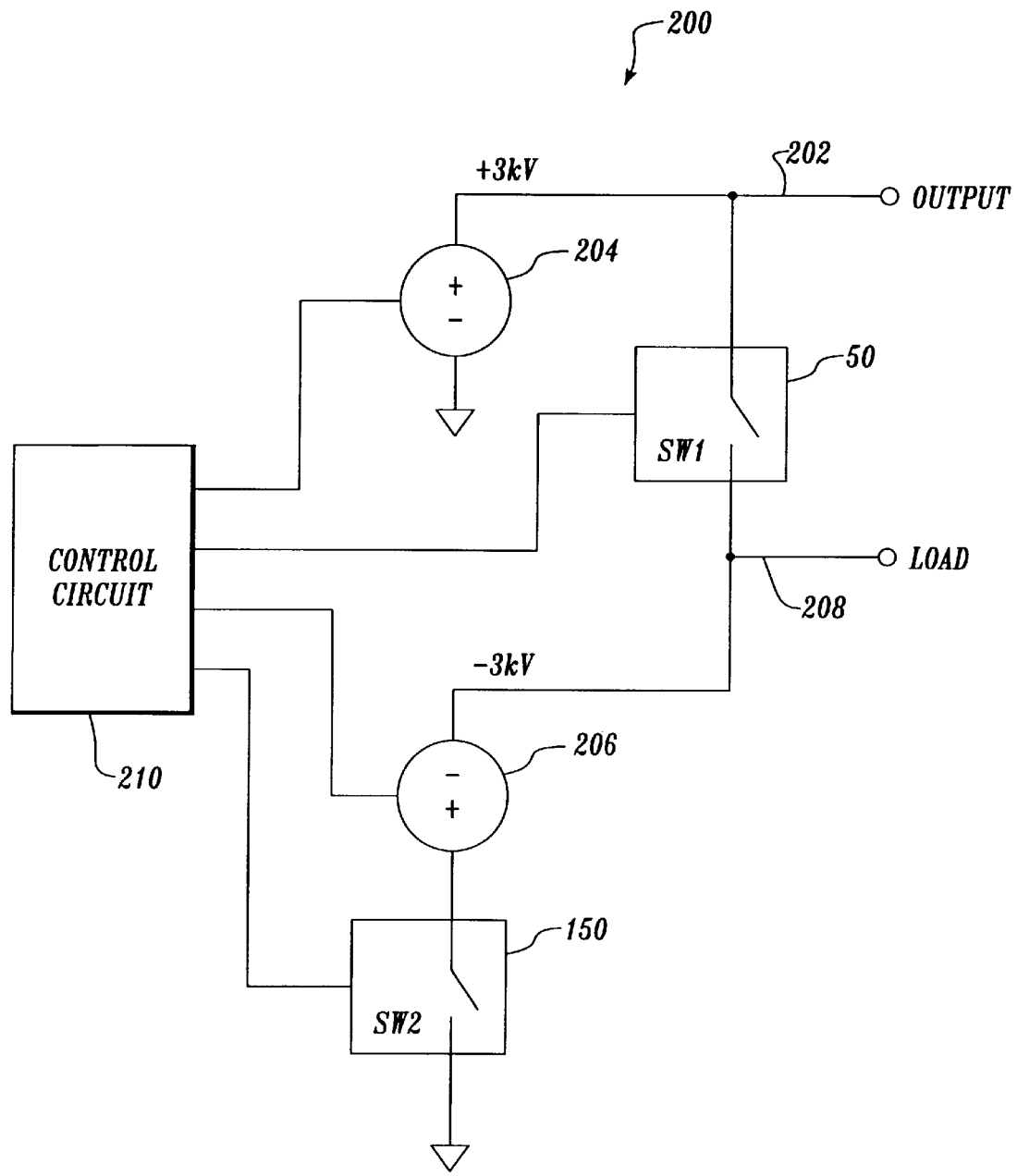
FIG. 5 is a block diagram of a switching power supply in accordance with the present invention.

The performance and basic design of the switching circuit disclosed herein may be adapted to suit a particular application. For example, switching circuits 50 and 150 can be used in a switching power supply 200 as shown in FIG. 5. The switching power supply 200 is suitable for use in many applications, such as the electrostatic chuck application described with respect to FIG. 1. In the switching power supply 200, the switching circuit 50 depicted in FIG. 2 connects a first high voltage generator 204 with a second high voltage generator 206. The switching circuit 150 depicted in FIG. 4 connects the second high voltage generator 206 to ground. A control circuit 210 is connected to the first and second high voltages 204 and 206 to turn the generators on and off. The control circuit is also connected to switching circuits 50 and 150 to turn the switches on and off.

In an actual embodiment of the switching power supply 200, the first high voltage generator 204 generates +3,000 volts and the second high voltage generator 206 generates −3,000 volts. The output voltage on load line 208 is switched between the two voltages generated by the high voltage generators to change the polarity of the output voltage. A timing diagram depicting the control signals generated by the control circuit 210 to cause a change in voltage polarity on the load line is provided in FIG. 6.

Figure 6:
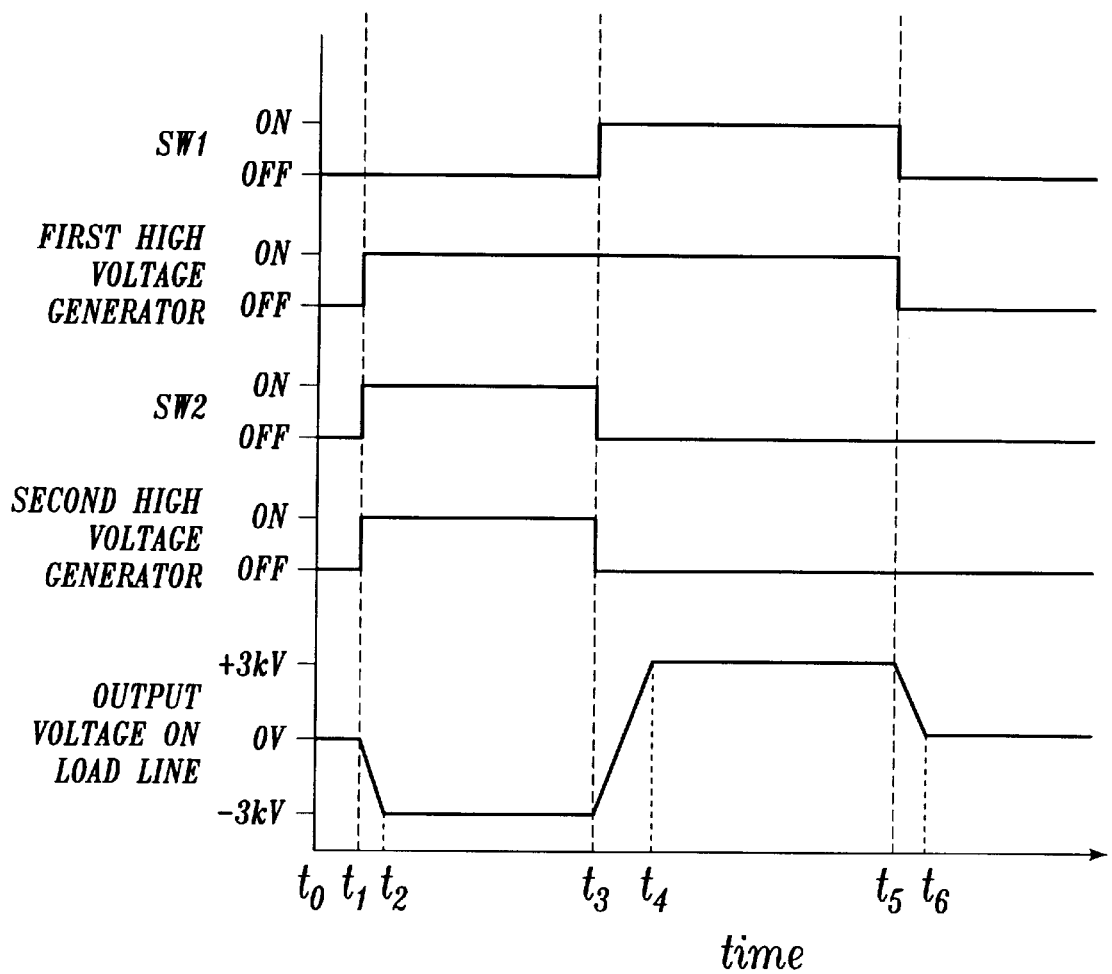
FIG. 6 is a timing diagram of representative control signals applied to the switching power supply of FIG. 5 to cause the polarity of the output voltage to switch.

With reference to FIG. 6, at a time to the high voltage generators are turned off and the switching circuits are turned off (or nonconducting). At a time $t_1$, the first and second high voltage generators 204 and 206 are turned on. Simultaneously, switching circuit 150 is turned on so that it connects the second high voltage generator 206 to ground. As the switching circuit begins to conduct current, the output voltage on the load line 208 begins to approach the voltage generated by the second high voltage generator. Because of the controlled switching of the switching circuit, the voltage on the load line drops linearly until −3,000 volts is reached at time $t_2$. During this period, switching circuit 50 isolates the load line from the output line, allowing the output line to be maintained at +3,000 volts.

To switch the polarity of the output voltage on the load line, at a time $t_y$, the second high voltage generator 206 and the switching circuit 150 are turned off. Simultaneously, switching circuit 50 is turned on, causing a conductive path to be created in a controlled manner between the first high voltage generator 204 and the load line 208. Because of the controlled switching of the switching circuit, the voltage on the load line rises linearly from −3,000 volts until +3,000 volts is reached at time $t_4$. The polarity of the output voltage from the switching power supply is thereby reversed. Because the polarity reversal is performed in a controlled manner, the high voltage generator 204 is able to compensate for a change in load and ensure that the potential on an output line 202 does not droop. In a preferred embodiment of the switching power supply, the voltage reversal is performed in approximately 100 milliseconds. Those skilled in the art will appreciate that other switching times may be selected by appropriate selection of the components within the switching circuits.

To turn off the switching power supply 200, at a time $t_5$ the first high voltage generator 204 and the switching circuit 50 are turned off. Switching off the switching circuit causes the output voltage on the load line 208 to linearly drop until zero volts is reached at time $t_6$.

From the above description, it will be appreciated that the switching circuit of the present invention is advantageous in that the switching occurs in a controlled and linear manner, improving the operation of power supplies that incorporate the switching circuit. Moreover, because the switching circuit is reliant upon solid-state transistors for switching, the overall size of the device is minimized. Constructing the switching circuit from solid-state devices also greatly improves the reliability of the device.

While the preferred embodiment of the invention has been illustrated and described, it will be apparent that various changes can be made therein without departing from the spirit and scope of the invention. For example, those skilled in the art will recognize that while each component stage is constructed with two transistors TR, a single transistor having a higher voltage rating may be substituted for the two transistors. Two transistors are advantageous, however, in that inexpensive transistors having lower voltage ratings may be used to construct the switching circuit. It is therefore an object of the appended Claims to cover all modifications and variations that come within the true spirit and scope of the invention.

The embodiments of the invention in which an exclusive property or privilege is claimed are defined as follows:

1. A solid-state switch circuit for selectively electrically connecting a first terminal to a second terminal, a potential existing between the first and second terminals, the solid-state switch circuit comprising:

(a) a driver stage configured to generate an enable signal at a control lead;

(b) a current regulator stage having a control node, a current input node and a current output node, the control and current output nodes of the current regulator stage being respectively coupled to the control lead and the second terminal, wherein the current regulator stage is configured to have an ON state and an OFF state, and further configured to transition from the OFF state to the ON state in response to receiving the enable signal, the current regulator operative in the ON state to conduct current from the current regulator stage current input node of the current regulator stage to the current output node of the current regulator stage and operative in the OFF state to prevent current from flowing from the current input node of the current regulator stage to the second terminal; and (c) a first component stage having a control node, a current input node and a current output node, wherein the control, current input and current output nodes of the first component stage are respectively coupled to the control lead, the first terminal and the current input node of the current regulator stage, and wherein the first component stage is configured to provide a current path from the first terminal to the current output node of the first component stage in response to the current regulator stage conducting current from the current input node of the current regulator stage to the second terminal.

2. The solid-state switch circuit defined in claim 1 wherein the first component stage is configured to have a biased-ON state and a biased-OFF state, and wherein the first component stage is configured to transition from the biased-OFF state to the biased-ON state in response to a voltage level at the current output node of the first component stage reaching a threshold potential while the driver stage is generating the enable signal.

3. The solid-state switch circuit defined in claim 1 wherein the current regulator stage is configured, when in the ON state, to monitor the current flowing to the second terminal from the current input node of the current regulator stage and to control the current to stabilize at a predetermined substantially constant rate.

4. The solid-state switch circuit defined in claim 3 wherein the current regulator stage comprises a feedback circuit configured, when the current regulator stage is in the ON state, to monitor and control the current flowing to the second terminal from the current input node of the current regulator stage.

5. The solid-state switch circuit defined in claim 1 wherein the first component stage further comprises a first shunting circuit coupled to the current input and current output nodes of the first component stage, and wherein the first shunting circuit is configured to provide a current path between the current input and current output nodes of the first component stage in response to a voltage between the current input and current output nodes of the first component stage exceeding a first predetermined voltage.

6. The solid-state switch circuit defined in claim 5 wherein the current regulator stage further comprises a second shunting circuit coupled to the current input and current output nodes of the current regulator stage, the second shunting circuit being configured to provide a current path between the current input and current output nodes of the current regulator stage in response to a voltage between the current input and current output nodes of the current regulator stage exceeding a second predetermined voltage.

7. The solid-state switch circuit defined in claim 6 wherein the first and second shunt circuits comprise a first diode and a second diode, respectively, and wherein the first and second diodes are configured to conduct in avalanche when the voltage across the first and second diodes exceeds the first predetermined voltage and the second predetermined voltage, respectively, the first and second predetermined voltages being substantially equivalent.

8. The solid-state switch circuit defined in claim 1 further comprising a plurality of additional component stages coupled in cascade, each component stage of the additional component stages being substantially identical to the first component stage, wherein the plurality of additional component stages are configured to couple the current output node of the first component stage to the current input node of the current regulator stage.

9. The solid-state switch circuit defined in claim 8 wherein each component stage of the plurality of additional component stages has a control node, a current input node and a current output node, wherein the control, current input and current output nodes of each component stage are respectively coupled to the control lead, the current output node of a preceding stage and the current input node of a following stage, and wherein each component stage is configured to provide a current path from its current input node to its current output node in response to the following stage conducting current from the current input and current output nodes of the following stage.

10. The solid-state switching power supply defined in claim 9 wherein the current regulator stage, the first component stage and each component stage of the plurality of additional component stages each comprises a field effect transistor, the field effect transistor of each of these stages having a channel coupling the current input node and current output node of the stage.

11. A power supply for supplying power to a load, the solid-state power supply comprising:

(a) a first high voltage source having a first high voltage output terminal, wherein the first high voltage source is configured to provide a first high voltage of a first polarity at the first high voltage output terminal;

(b) a second high voltage source having a second high voltage terminal and a load terminal, the load terminal configured to be coupled to the load, wherein the second high voltage source is configured to provide a second high voltage of a second polarity different from the first polarity at the second high voltage output terminal;

(c) a first solid-state switch circuit coupled to the first high voltage output terminal and the load terminal, the first solid-state switch circuit having an ON state and an OFF state, wherein, in the ON state, the first solid-state switch circuit is configured to provide a first current path between the first high voltage output terminal and the load terminal so that a current flowing through the first current path stabilizes at a first substantially constant predetermined rate and, when in the OFF state, the first solid-state switching circuit is configured to prevent any current from flowing through the first current path;

(d) a second solid-state switching circuit coupled to the second high voltage output terminal and a ground terminal, the second solid-state switch circuit having an ON state and an OFF state, wherein, in the ON state, the second solid-state switch circuit is configured to provide a second current path between the second high voltage output terminal and the ground terminal so that a current flowing through the second current path stabilizes at a second substantially constant predetermined rate and, when in the OFF state, the second solid-state switching circuit is configured to prevent any current from flowing through the second current path; and (e) a control circuit coupled to the first and second solid-state switching circuits, the control circuit configured to provide control signals to the first and second solid-state switching circuits that cause the first and second solid-state switching circuits to enter ON or OFF states.

12. The power supply defined in claim 11 wherein the first solid-state switching circuit and the second solid-state switching circuit are substantially identical in structure, the first solid-state switching circuit comprising:

(a) a driver stage coupled to receive a control signal from the control circuit, wherein the driver circuit is configured to generate an enable signal at a control lead in response to receiving the control signal;

(b) a current regulator stage having a control node, a current input node and a current output node, the control and current output nodes of the current regulator stage being respectively coupled to the control lead and the load terminal, wherein the current regulator stage is configured to transition from the OFF state to the ON state in response to receiving the enable signal, the current regulator operative in the ON state to conduct current from the current input node of the current regulator stage to the load terminal and operative in the OFF state to prevent current from flowing from the current input node of the current regulator stage to the load terminal; and (c) a first component stage having a control node, a current input node and a current output node, the control, current input and current output nodes of the first component stage being respectively coupled to the control lead, the first high voltage output terminal of the first high voltage source and the current input node of the current regulator stage, wherein the first component stage is configured to conduct current from the first high voltage output terminal to the current output node of the first component stage in response to the current regulator stage conducting current from the current input node of the current regulator stage to the load terminal.

13. The power supply defined in claim 12 wherein the first component stage is configured to have a biased-ON state and a biased-OFF state, and wherein the first component stage is configured to transition from the biased-OFF state to the biased-ON state in response to a voltage level at the current output node of the first component stage reaching a first threshold potential while receiving the first enable signal.

14. The power supply defined in claim 13 wherein the current regulator stage comprises a feedback circuit configured, when the current regulator stage is in the ON state, to monitor and control the current flowing to the load terminal from the current input node of the current regulator stage.

15. The power supply defined in claim 11 wherein the first component stage further comprises a first shunting circuit coupled to the current input and current output nodes of the first component stage, and wherein the first shunting circuit is configured to provide a current path between the current input and current output nodes of the first component stage in response to a voltage between the current input and current output nodes of the first component stage exceeding a first predetermined voltage.

16. The power supply defined in claim 15 wherein the current regulator stage further comprises a second shunting circuit coupled to the current input and current output nodes of the current regulator stage, the second shunting circuit being configured to provide a current path between the current input and current output nodes of the current regulator stage in response to a voltage between the current input and current output nodes of the current regulator stage exceeding a second predetermined voltage.

17. The power supply defined in claim 16 wherein the first and second shunt circuits comprise a first diode and a second diode, respectively, and wherein the first and second diodes are configured to conduct in avalanche when the voltage across the first and second diodes exceeds the first predetermined voltage and the second predetermined voltage, respectively, the first and second predetermined voltages being substantially equivalent.

18. The power supply defined in claim 11 further comprising a plurality of additional component stages coupled in cascade, each component stage of the additional component stages being substantially identical to the first component stage, wherein the plurality of additional component stages are configured to couple the current output node of the first component stage to the current input node of the current regulator stage.

19. The power supply defined in claim 18 wherein the current regulator stage, the first component stage and each component stage of the plurality of additional component stages each comprises a field effect transistor, the field effect transistor of each of these stages having a channel coupling the current input node and current output node of the stage.

20. A method for selectively electrically connecting a first terminal to a second terminal using a solid-state switching circuit having a current regulator stage and a first component stage, the first component stage having a shunting circuit, the method comprising:

(a) generating an enable signal;

(b) receiving the enable signal at the current regulator stage and responsive thereto providing a first current path between the second terminal and the first component stage, whereby a current flows from the first terminal to the second terminal through the first current path and the shunting circuit; and (c) receiving the enable signal at the first component stage and responsive to receiving the enable signal and to the current flowing in the first current path, providing a second current path from the first terminal to the first current path of the current regulator stage, wherein the current flowing from the first terminal to the second terminal flows through the first and second current paths without flowing through the shunting circuit.

21. The method defined in claim 20 further comprising:

monitoring the current flowing through the first current path; and controlling the current flowing through the first current path to stabilize at a predetermined substantially constant level.

22. The method defined in claim 21 further comprising controlling the current flowing through the first current path to discharge the first terminal to the second terminal in a predetermined amount of time.

* * * * *